United States Patent
Yang et al.

(10) Patent No.: US 11,502,679 B2
(45) Date of Patent: Nov. 15, 2022

(54) ROBUST POWER-ON-RESET CIRCUIT WITH BODY EFFECT TECHNIQUE

(71) Applicant: MACRONIX INTERNATIONAL CO., LTD., Hsinchu (TW)

(72) Inventors: Shang-Chi Yang, Changhua (TW); Jhen-Sheng Chih, Hsinchu (TW); Jian-Syu Lin, Chiayi (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/214,483

(22) Filed: Mar. 26, 2021

(65) Prior Publication Data
US 2022/0052683 A1 Feb. 17, 2022

Related U.S. Application Data

(60) Provisional application No. 63/064,939, filed on Aug. 13, 2020.

(51) Int. Cl.
| H03K 17/00 | (2006.01) |
| H03K 17/22 | (2006.01) |
| H03K 17/30 | (2006.01) |
| H03K 17/16 | (2006.01) |

(52) U.S. Cl.
CPC ......... *H03K 17/223* (2013.01); *H03K 17/162* (2013.01); *H03K 17/22* (2013.01); *H03K 17/302* (2013.01)

(58) Field of Classification Search
None
See application file for complete search history.

(56) References Cited

U.S. PATENT DOCUMENTS

| 5,469,099 A | 11/1995 | Konishi et al. |
| 6,362,669 B1 | 3/2002 | Zhou et al. |
| 6,469,552 B2 | 10/2002 | Ohbayashi et al. |
| 6,677,785 B1 * | 1/2004 | Peng ................ G01R 19/16547 327/74 |
| 6,759,852 B1 * | 7/2004 | Samad ................ H03K 17/223 324/522 |
| 6,972,602 B2 | 12/2005 | Akamatsu et al. |
| 7,019,417 B2 | 3/2006 | Kang |

(Continued)

OTHER PUBLICATIONS

TW Office Action from family member TW110125552A dated May 6, 2022, 12 pages.

*Primary Examiner* — Tuan T Lam
(74) *Attorney, Agent, or Firm* — Andrew L. Dunlap; Haynes Beffel & Wolfeld LLP

(57) ABSTRACT

An integrated circuit with a power-on-reset circuit includes an inverter circuit connected between the first and second supply node, a cascode-connected series of transistors MCn, for n going from 1 to N, connected between the first supply node and the input node of the inverter, and a resistive element connected between the input node of the inverter and the second supply node. The transistors in the cascode-connected series of transistors MCn pull up the input node voltage above a trip point voltage when the voltage between the input node and the first supply node is more than a threshold of the cascode-connected series. A circuit connected between the first and second supply nodes is responsive to a POR pulse output by the inverter.

18 Claims, 5 Drawing Sheets

(56) References Cited

U.S. PATENT DOCUMENTS

| | | | |
|---|---|---|---|
| 8,836,386 B1* | 9/2014 | Hwang | H03K 17/22 |
| | | | 327/143 |
| 2004/0036514 A1 | 2/2004 | Kwon | |
| 2007/0080725 A1* | 4/2007 | Byeon | G11C 5/14 |
| | | | 327/143 |
| 2007/0085578 A1* | 4/2007 | Jeong | H03K 17/284 |
| | | | 327/143 |
| 2007/0222528 A1* | 9/2007 | Pernia | H03B 5/1228 |
| | | | 331/44 |
| 2008/0048743 A1* | 2/2008 | Seo | G06F 1/24 |
| | | | 327/198 |
| 2010/0023794 A1* | 1/2010 | Jeong | H03K 17/284 |
| | | | 713/500 |
| 2011/0074470 A1* | 3/2011 | Sanborn | H03K 17/223 |
| | | | 327/143 |
| 2011/0133276 A1 | 6/2011 | Thei et al. | |
| 2014/0307517 A1* | 10/2014 | Jang | G11C 7/20 |
| | | | 365/227 |
| 2017/0011780 A1* | 1/2017 | Kim | H03K 17/223 |
| 2017/0117890 A1* | 4/2017 | Kanda | G11C 5/14 |
| 2022/0014181 A1* | 1/2022 | Geyari | G11C 16/22 |

* cited by examiner $$V_T = V_{T0} + \gamma \cdot \left(\sqrt{|V_{SB} - 2\varphi_F|} - \sqrt{|2\varphi_F|}\right)$$
$V_{SB} \downarrow V_T \uparrow$
FIG. 6
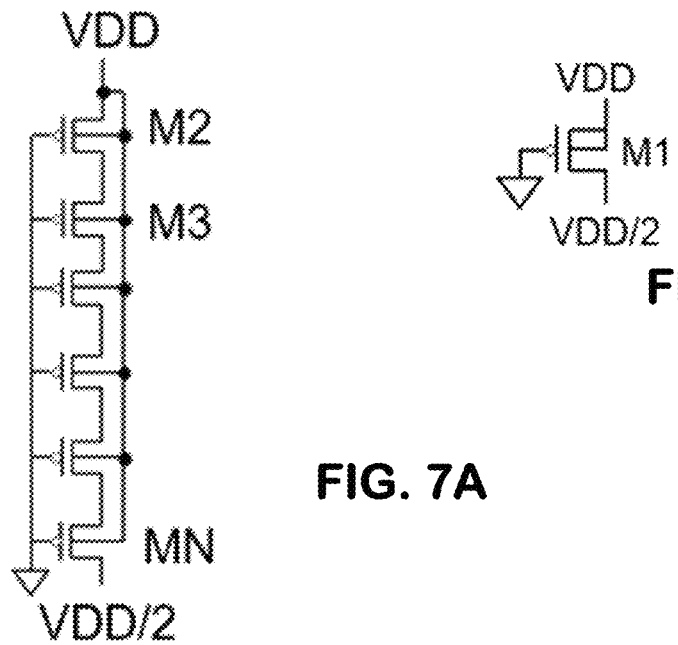
FIG. 7B
FIG. 7A
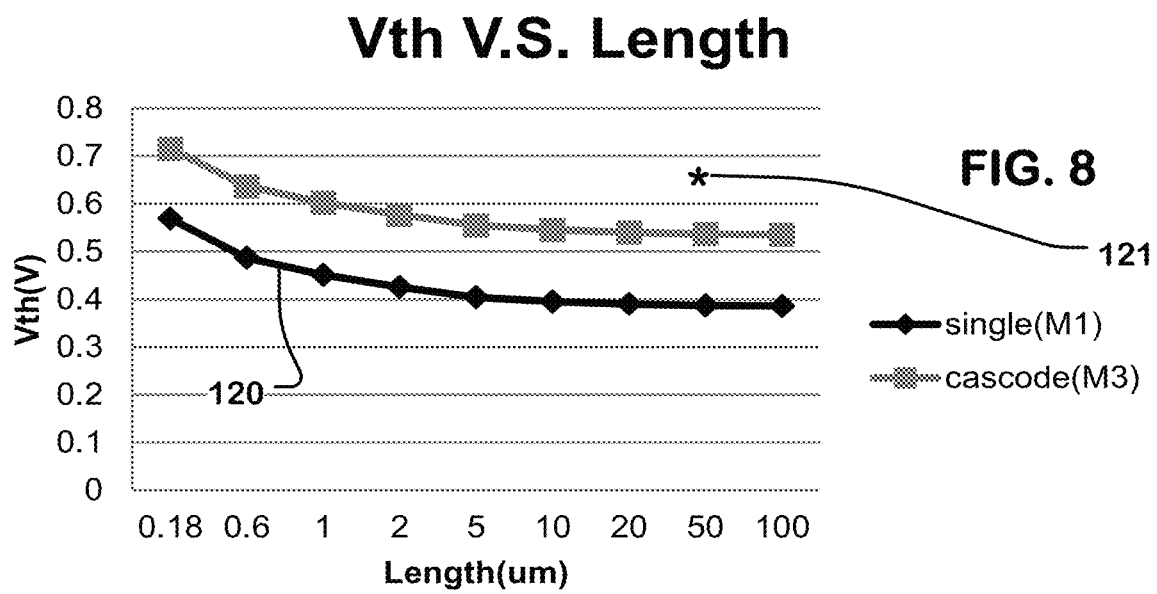
FIG. 8

ROBUST POWER-ON-RESET CIRCUIT WITH BODY EFFECT TECHNIQUE

PRIORITY APPLICATION

This application claims the benefit of U.S. Provisional Patent Application No. 63/064,939 filed 13 Aug. 2020, which application is incorporated herein by reference.

BACKGROUND

Field

The present invention relates to low voltage integrated circuits, and to power-on-reset circuits suitable for use in such circuits.

Description of Related Art

Integrated circuits are being manufactured for operation at low-power supply voltages. Power supply voltages are typically applied to pins that connect to the power rails of a circuit on the integrated circuit chip carrying power supply voltages sometimes referred to as VDD, usually a positive voltage, and VSS usually a ground reference voltage. The pins that are connected to the power supply rails are known as the power-supply pins.

Many integrated circuits use power-on-reset (POR) circuits connected to power supply nodes, such as power-supply pins or to power rails, to detect recovery of the power supply voltage across the pins or power rails after a power down event, and generate a control signal often called a power-on-reset POR signal. Internal circuitry responds to the POR signal, to establish a known state (e.g., reset or initialized) for the internal circuitry as the power supply recovers.

Power supply voltages can be interrupted for many reasons, and can rise and fall with different time/voltage slopes, sometimes specified in microseconds/Volt (μsec/V), and with peaks and valleys as the power supply fluctuates during restart.

As power supply specifications for integrated circuits drop below 3.3 volts, implementation of stable power-on-reset circuits is becoming more complicated.

Thus, a stable power-on-reset circuit for integrated circuits is desired which can cover any power supply slope, can operate at low voltages and is consistent across process/voltage/temperature (PVT) variations.

SUMMARY

A circuit is described which can generate a control signal, such as a POR signal, in response to changes in voltage across first and second supply nodes, which operates with low power supply voltages, and is stable across PVT variations.

An example circuit comprises a p-channel transistor having a gate, a source connected to the first supply node, and a drain connected to an output node; an n-channel transistor having a gate connected to the gate of the p-channel transistor, a drain connected to the output node and a source connected to the second supply node; a resistive element connected between the gate of the p-channel transistor and the second supply node; and a cascode-connected series of p-channel transistors MCn, for n going from 1 to N, connected between the first power supply node and the gate of the p-channel transistor.

The number N of transistors in the cascode-connected series can be 2 or more, and in some embodiments more than 4.

An integrated circuit having first and second supply nodes is described that comprises an inverter circuit connected between the first and second supply nodes, having an input node and an output node. As the power supply voltage (e.g. VDD) on the first supply node rises, the inverter switches the output node to the first supply node (e.g. VDD) when a voltage between the input node and the first supply node is more than a first trip point, and switches the output node to the second supply node (e.g. VSS) when a voltage between the input node and the second supply node is more than a second trip point, resulting in a pulse usable as a POR pulse. A circuit is connected between the first supply node and the input node of the inverter, and a resistive element connected between the input node of the inverter and the second supply node, to control the voltage on the input node of the inverter in a manner that safely results in generation of the POR pulse. The circuit includes a p-channel transistor, and a circuit generating a source-to-substrate voltage on the p-channel transistor that reduces a pull-up driving ability of the circuit including the p-channel transistor relative to a pull-up driving ability of the inverter circuit. The circuit including the p-channel transistor includes in this embodiment a cascode-connected series of transistors MCn, for n going from 1 to N, connected between the first supply node (e.g. VDD) and the input node of the inverter, which is configured to generate increasing differences in voltage between the sources and substrates on the transistors in the series, or voltages which are increasingly more negative. In embodiments described herein, the transistors in the cascode-connected series of p-channel transistors MC1 to MCn have gates connected to the second supply node (e.g. VSS) and bodies connected to the first supply node (e.g. VDD).

Other aspects and advantages of the present invention can be seen on review of the drawings, the detailed description and the claims, which follow.

BRIEF DESCRIPTION OF THE DRAWINGS

FIG. 6 is a formula for PMOS threshold voltage.

FIG. 7A illustrates a cascode-connected series of PMOS transistors, with source to body bias.

FIG. 7B illustrates a PMOS transistor, without a source to body bias.

FIG. 8 is a graph of threshold voltage versus channel length for a single transistor, and for cascode-connected transistor.

DETAILED DESCRIPTION

A detailed description of embodiments of the present invention is provided with reference to the FIGS. 1-11.

Figure 1:
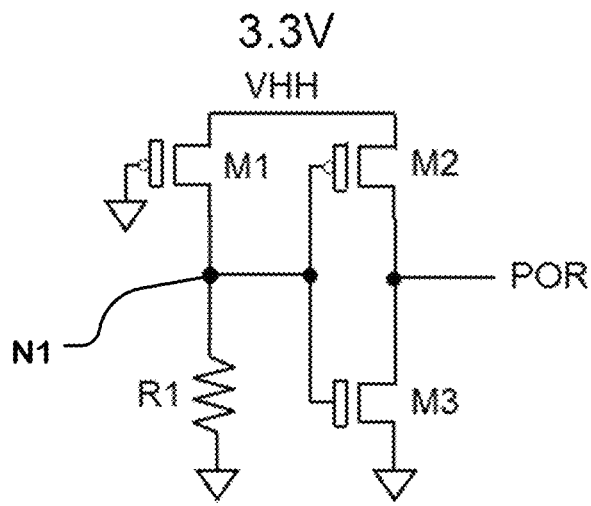
FIG. 1 illustrates a circuit that can generate a power-on-reset POR pulse.

FIG. 1 is a circuit diagram of a circuit that can generate a power-on-reset POR pulse. The circuit includes a p-channel transistor M1 connected between a power supply node receiving voltage VDD and node N1, and a resistor R1 connected between node N1 and a reference supply node receiving voltage VSS such as ground. Also, the circuit includes a p-channel transistor M2 connected between the power supply node receiving voltage VDD, specified at 3.3 V, and an output node POR at which a power-on-reset pulse is generated, and an n-channel transistor M3 connected between node POR and the reference supply node. The gates of the transistor M2 and transistor M3 are connected to node N1, and are configured as an inverter. The transistor M1 can be implemented using a longer channel length than transistor M2, so that M2 has a stronger driving capability and lower threshold voltage than transistor M1.

Figure 2:
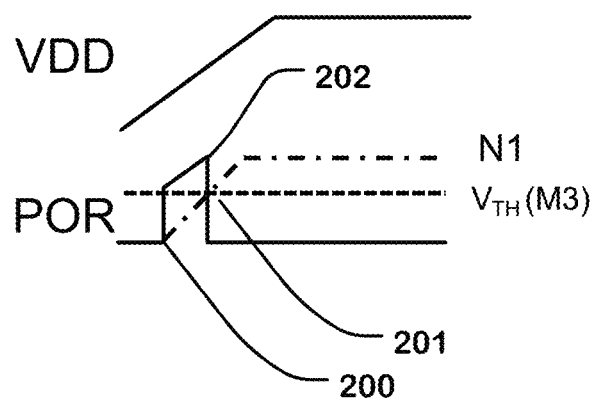
FIG. 2 is a timing diagram for a circuit like that of FIG. 1, in which the threshold voltage of transistor M2 is less than the threshold voltage of transistor M1.
Figure 3:
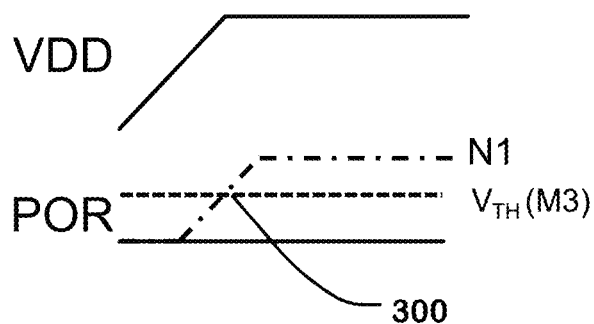
FIG. 3 is a timing diagram for a circuit like that of FIG. 1, in which the threshold voltage of transistor M2 is greater than the threshold voltage of transistor M1.

Operation of the circuit can be understood with reference to FIGS. 2 and 3. In FIG. 2, operation is illustrated for a case in which p-channel transistor M2 on the output leg has a stronger driving ability, and a lower threshold voltage than the p-channel transistor M1 on the input leg.

During a power-up sequence, a voltage on a power supply rail on an integrated circuit will ramp up as shown on the trace labeled VDD. The slope of the ramp can vary depending on the conditions under which the power supply is recovering.

While VDD is very low, node N1 is held at the reference voltage ground by resistor R1. Both transistors M2 and M3 will remain off until the supply voltage VDD exceeds the voltage at node N1 by the threshold voltage of transistor M2, at time 200, after which output node POR is pulled up to the value of VDD. Since the threshold voltage of transistor M1 is greater than that of transistor M2, node N1 remains low. As VDD continues to rise to and above a threshold of the transistor M1, the voltage on node N1 will rise as transistor M1 begins to conduct current, pulling up node N1. At time 201, the voltage on node N1 reaches the threshold of transistor M3, which turns on and pulls down the output node POR. As transistor M1 fully turns on, the node N1 will rise to a maximum level.

The magnitude of the POR reset signal has a peak 202 greater than the threshold voltage of transistor M3, and of transistors in the logic circuits that are designed to switch in response to the POR reset signal, by an amount sufficient for reliable operation.

As illustrated in FIG. 3 however, if the threshold voltage of transistor M1 is lower than that of transistor M2, no pulse is generated. FIG. 3 illustrates a power-up sequence for a case in which p-channel transistor M2 on the output leg has a larger threshold voltage than the p-channel transistor M1 on the input leg. As seen in FIG. 3, if the threshold voltage of transistor M1 is smaller than that of transistor M2, transistor M1 begins conducting current and the voltage on node N1 starts to rise before transistor M2 turns on to pull up the output node POR. As VDD increases, the voltage on node N1 rises above the threshold of transistor M3 holding the output node POR down, so the voltage on the output node POR may remain at a low level. In this case, no POR pulse is generated.

In order to ensure that transistor M1 has a greater threshold voltage and weaker driving ability than transistor M2, a traditional approach has been to configure transistor M1 to have a longer channel length than transistor M2.

Figure 4:
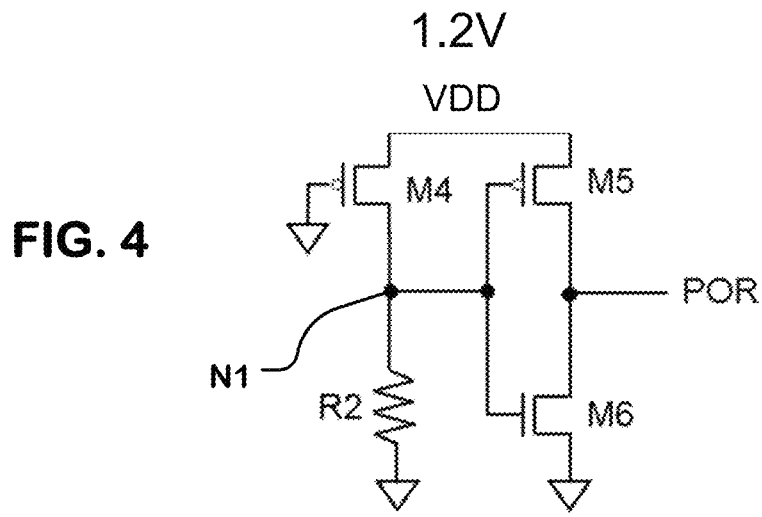
FIG. 4 illustrates a circuit using low voltage transistors.

Also, as VDD specifications decrease, the high voltage transistors may have threshold voltages which are too high for the POR circuit to operate within specifications. Thus, a circuit is needed that can generate a power-on-reset POR pulse for a lower specified power supply voltage, such as 1.2 V. The circuit of FIG. 4 is implemented using "low voltage transistors, which can have lower threshold voltages suitable for circuits having lower power supply voltage. The circuit includes a p-channel transistor M4 connected between a power supply node receiving voltage VDD and node N1, and a resistor R2 connected between node N1 and a reference supply node receiving voltage VSS such as ground. Also, the circuit includes a p-channel transistor M5 connected between the power supply node receiving voltage VDD and an output node POR at which a power-on-reset pulse is generated, and an n-channel transistor M6 connected between node POR and the reference supply node. The gates of the transistor M5 and transistor M6 are connected to node N1, and are configured as an inverter.

However, low voltage transistors can suffer a reverse short channel effect, which causes the threshold voltage to decrease with channel length.

Figure 5:
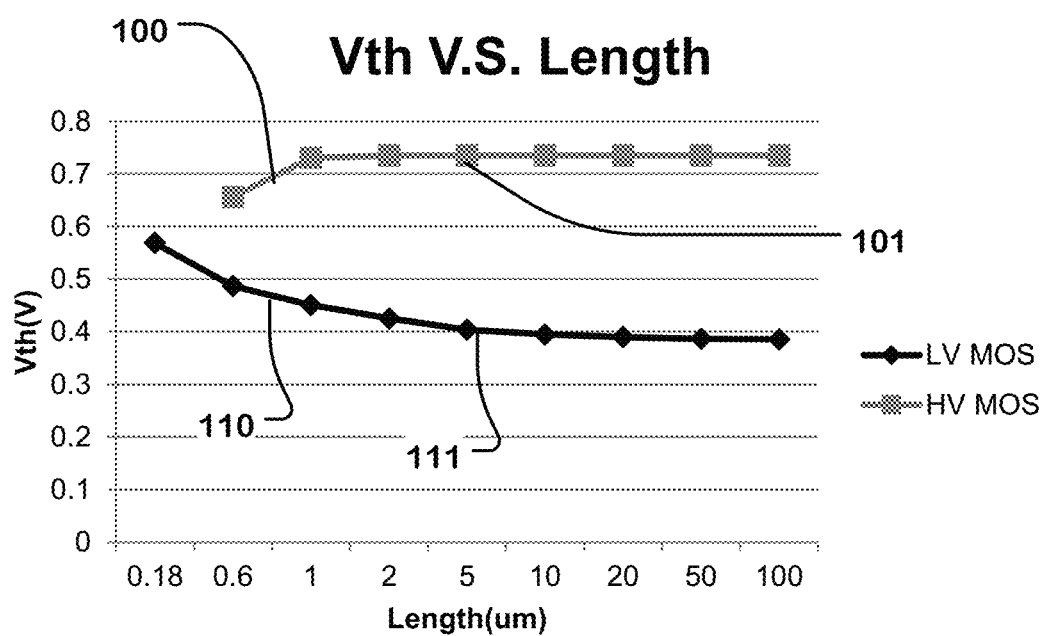
FIG. 5 is a graph of threshold voltage versus channel length for low voltage and high voltage transistors.

FIG. 5 is a graph of threshold voltage versus channel length for "high-voltage" transistors and "low-voltage" transistors. High voltage transistors (HV MOS) have a short channel effect, by which the threshold voltages decrease as channel length decrease. Thus, referring to FIG. 1, if transistor M2 has a length of about 0.8 micron near location 100, and transistor M1 has a length of about 5 microns near location 101, M2 will have a lower threshold and higher driving ability than transistor M1. So, the circuit operates properly as shown in FIG. 2.

As can be seen in Figure, low voltage transistors have lower threshold voltages and can operate safely with lower power supply voltages. However, the threshold voltage varies as a result of a reverse short channel effect, increasing with shorter channels and decreasing with increased channel length. This reverse short channel effect makes the increasing the channel length for transistor M4 to cause the decreasing threshold voltage, so that the effect of FIG. 3 above is more likely, causing the circuit to fail to generate a POR pulse. Thus referring to FIG. 4, if transistor M5 has a length of about 0.8 micron near location 110, and transistor M4 has a length of about 5 microns near location 111, M4 will have a lower threshold and higher driving ability than transistor M5. So the circuit will fail as in FIG. 3.

FIG. 6 shows a formula for determining a threshold voltage for a PMOS transistor, in which the parameter $V_{SB}$ is the source-to-substrate voltage. The formula includes a factor added to the constant $V_{T0}$ which when $V_{SB}$ is negative and as $V_{SB}$ becomes more negative, the factor increases, and as a result $V_T$ increases. This relationship between $V_{SB}$ and $V_T$ is a result of the so-called body effect.

FIGS. 7A and 7B illustrate a cascode-connected series of transistors (M2, M3, . . . MN) and a single transistor (M1) configured with the body connected to VDD. The single transistor M1 will have VSB=0V. In the cascode-connected series of transistors (M2, M3, . . . MN), the source voltage falls along the series so that $V_{SB}$ becomes more negative along the series.

FIG. 8 is a graph of threshold voltage versus channel length for the transistor M1 of FIG. 7B and the transistor M3 in the cascode-connected series of FIG. 7A. Transistor M3 will have a lower source voltage than transistor M1, and so its $V_{SB}$ will be more negative. As a result of the body effect, the threshold of transistor M3 is higher than the threshold of M1 across the range of channel lengths in the graph.

In an example, the threshold voltages of the transistors M2 and MN in the cascode-connected series in FIG. 7A have been simulated to be about 0.5722 and 0.6506, respectively. The threshold of the transistor M1 in FIG. 7B has been simulated to be 0.5617. Therefore, the cascode-connected series of FIG. 7A will have a lower driving ability and higher threshold than transistor M1.

In FIG. 8, the upper trace represents the threshold of transistor M3. The threshold of the circuit will fall above that trace, because the transistor MN will have an even more negative $V_{SB}$. So, assuming an effective length for the cascode-connected series of 50 microns, the threshold voltage will be near, or above, point 121. Assuming the length of transistor M1 of about 0.8 micron, the threshold voltage will be close to point 120. Thus, the threshold voltage of transistor M1 (120) will be lower than the threshold voltage (121) of the cascode-connected series, and the driving ability of cascode-connected series will be less than the driving ability of the transistor M1.

Figure 9:
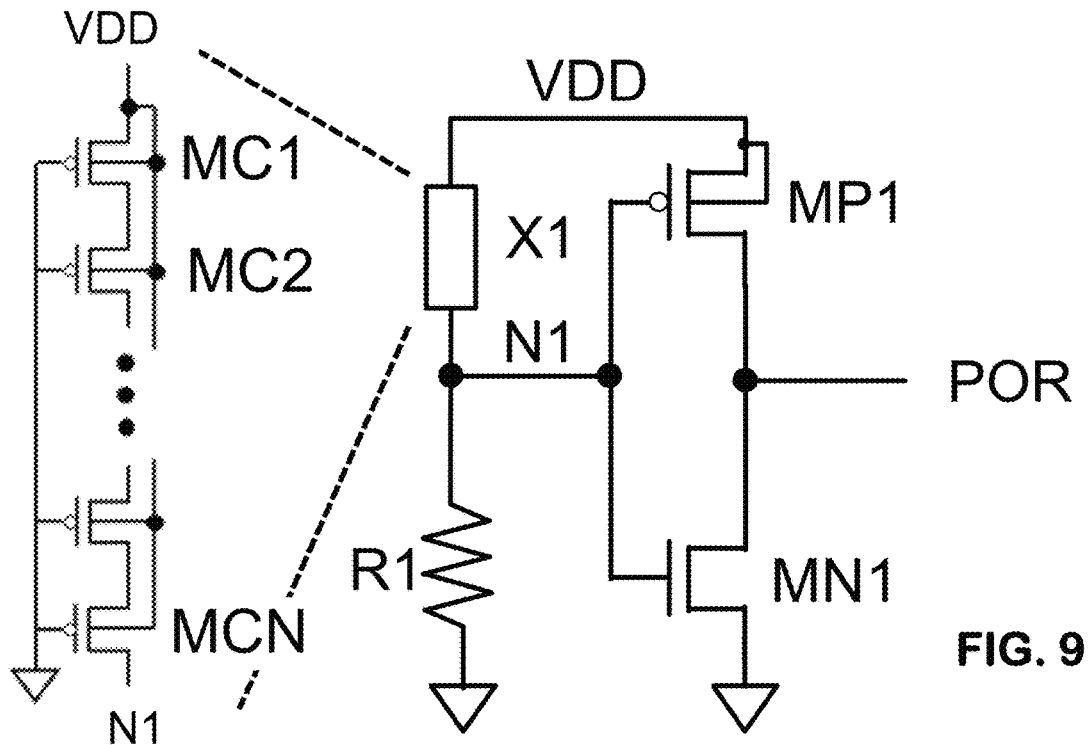
FIG. 9 is a circuit diagram of an improved power-on-reset circuit.

FIG. 9 illustrates an improved circuit for generating a power-on-reset signal. The circuit includes a circuit X1 having a first terminal connected, and in some embodiments directly connected, to a power supply node receiving voltage VDD and a second terminal connected, and in some embodiments directly connected, to node N1, and a resistor R1 connected, and in some embodiments directly connected, to node N1 and connected, and in some embodiments directly connected, to a reference supply node receiving voltage VSS, such as ground. The circuit X1 can comprise a cascode-connected series of p-channel transistors in which the gates of the transistors are connected, and in some cases directly connected to the reference supply node receiving voltage VSS.

Also, the circuit includes a p-channel PMOS transistor MP1 having a source connected, and in some embodiments directly connected, to the power supply node receiving voltage VDD and a drain connected, and in some embodiments directly connected, to an output node POR at which a power-on-reset pulse is generated. The circuit includes an n-channel NMOS transistor MN1 having a drain connected, and in some embodiments directly connected, to output node POR and a source connected, and in some embodiments directly connected, to the reference supply node receiving voltage VSS. The gates of the transistor MP1 and transistor MN1 are connected, and in some embodiments directly connected, to node N1, and are configured as an inverter.

The resistor R1 can be implemented using any type of resistance, including passive resistor elements such as a polysilicon strip or diffusion resistor.

An embodiment of the circuit X1 comprises a cascode-connected series of PMOS transistors MCn, for n going from 1 to N, connected between the first power supply node VDD and node N1 at the gate of the p-channel transistor MP1. The transistors in the cascode-connected series are p-channel transistors in this embodiment. The number N of transistors in the cascode-connected series depends on the particular manufacturing process, and can be at least 2. In some embodiments N is 4 or more. In some embodiments, N is at least 5.

The transistors in the cascode-connected series MC1 to MCN have gates connected to the reference supply node VSS and bodies connected to the power supply node VDD. The PMOS transistors in the cascode-connected series MC1 to MCN can be formed in separate n-wells, each connected to VDD, in a shared n-well connected to VDD, or in other configurations of n-wells.

As a result of the cascode configuration, the source-to-body voltage $V_{SB}$ of the transistors in the series becomes more negative as "n" increases, so that the $V_{SB}$ of transistor MCN is more negative than $V_{SB}$ of MC1, which causes variations in the body effect on the thresholds of the transistors. In this example, the threshold voltage of the transistors increases due to the body effect. Using this technique, the circuit X1 can be implemented reliably to have a threshold voltage greater than the threshold voltage of transistor MP1, even using very small transistors.

The cascode-connected series of transistors is an example of a circuit X1 generating a source-to-substrate voltage $V_{SB}$ on at least one of the p-channel transistor in the series (e.g. MCN), that reduces a pull-up driving ability of the circuit X1, relative to a pull-up driving ability of the inverter circuit.

A circuit like that of FIG. 9 can operate with supply voltages less than 2 V and, in some embodiments, a circuit is operable where the voltage across the first and second power supply nodes has a maximum specified value less than 1.6V. In some embodiments, the circuit can be applied in integrated circuits rated for operation with nominally 1.2 V power supply voltages, with a range of operation between specified values of 1.05 V and 1.3 V.

The circuit X1 is an example of a metal oxide semiconductor (MOS) circuit having a driving ability less than a driving ability of inverter circuit. MOS circuits other than cascode-connected series can be implemented with this feature.

The inverter circuit comprises a first p-channel transistor and a first n-channel transistor, and the circuit X1 has an equivalent threshold voltage more than a threshold voltage of first p-channel transistor. Also, the circuit X1 can have an equivalent channel length more than a channel length of first p-channel transistor.

Figure 10:
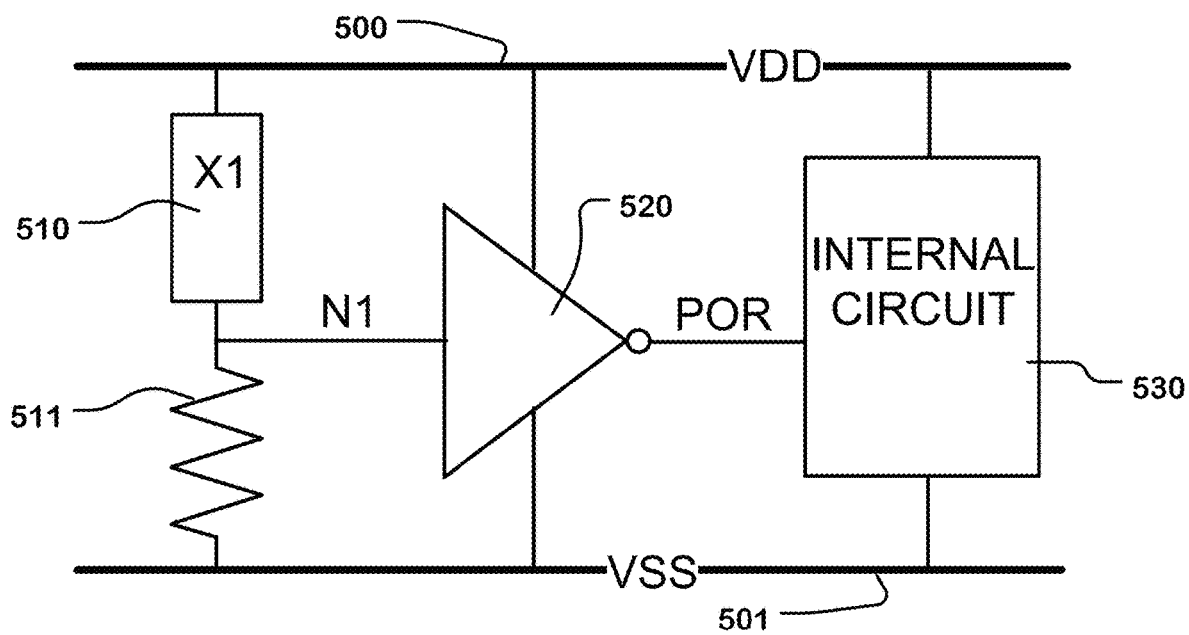
FIG. 10 is a block diagram of an integrated circuit including a power-on-reset circuit as described herein.

FIG. 10 is a simplified block diagram of an integrated circuit including a power-on-reset circuit as described herein. The integrated circuit includes power rails 500 and 501 which carry the supply voltage VDD and a reference voltage VSS, respectively. A circuit X1 (510) is connected between the power rail 500 and a node N1. A resistor 511 is connected between the node N1 and the power rail 501. An inverter 520 is connected between the power rail 500 and 501, as an input connected to the node N1. The output of the inverter 520 is a power-on-reset signal POR. The power-on-reset signal POR is supplied to an internal circuit 530, also connected between the first and second power rails 500 and 501. The power-on-reset signal POR can be a pulse used to reset, or set to a known safe state, another circuit on the integrated circuit, such as a state machine.

In the circuit of FIG. 10, the inverter 520 is connected between the first and second power rails 500 and 501, and has an input node at N1 and an output node at POR. The inverter 520 switches the output node to the first power rail 500 (e.g. VDD) when a voltage between the input node N1 and the first power rail 500 is more than a first trip point (e.g. threshold of MP1 in FIG. 9), and switches the output node to the second power rail 501 (e.g. VSS) when a voltage between the node N1 and the second power rail 501 is more than a second trip point (e.g. the threshold of MN1 in FIG. 9). The circuit X1 pulls up the input node N1 voltage above the second trip point when the voltage between the first and second power rails 500 and 501 is more than a threshold of the circuit X1. The circuit X1 can include a circuit to generate source-to-substrate voltage on at least one p-channel transistor in the circuit to establish a driving ability less than the driving ability of the inverter and a threshold higher than the first trip point of the inverter. As a result, the threshold of the circuit X1 is greater than the first trip point, and the pull-up driving ability of circuit X1 is less than the pull-up driving ability of the inverter, so as VDD increases in recovery from a power-down event, the circuit X1 should turn on after the inverter pulls the up the output node to the first power rail 500. As N1 rises after circuit X1 turns on, the inverter will pull down the output node of the inverter after the output node reaches a sufficient magnitude, forming a POR pulse.

The magnitude and duration of the pulse is a function of differences in the effective threshold voltages and pull-up driving abilities of the circuit X1 and the inverter. The magnitude and duration of the power-on-reset signal POR must be sufficient to ensure operation of the internal circuit 530. Thus, the magnitude must be greater than an operating voltage of the internal circuit 530. This operating voltage must be greater than the threshold voltage of the transistors, typically MOS transistors utilized in the circuit, as needed to drive initialization functions for the integrated circuit in response to the POR signal.

Figure 11:
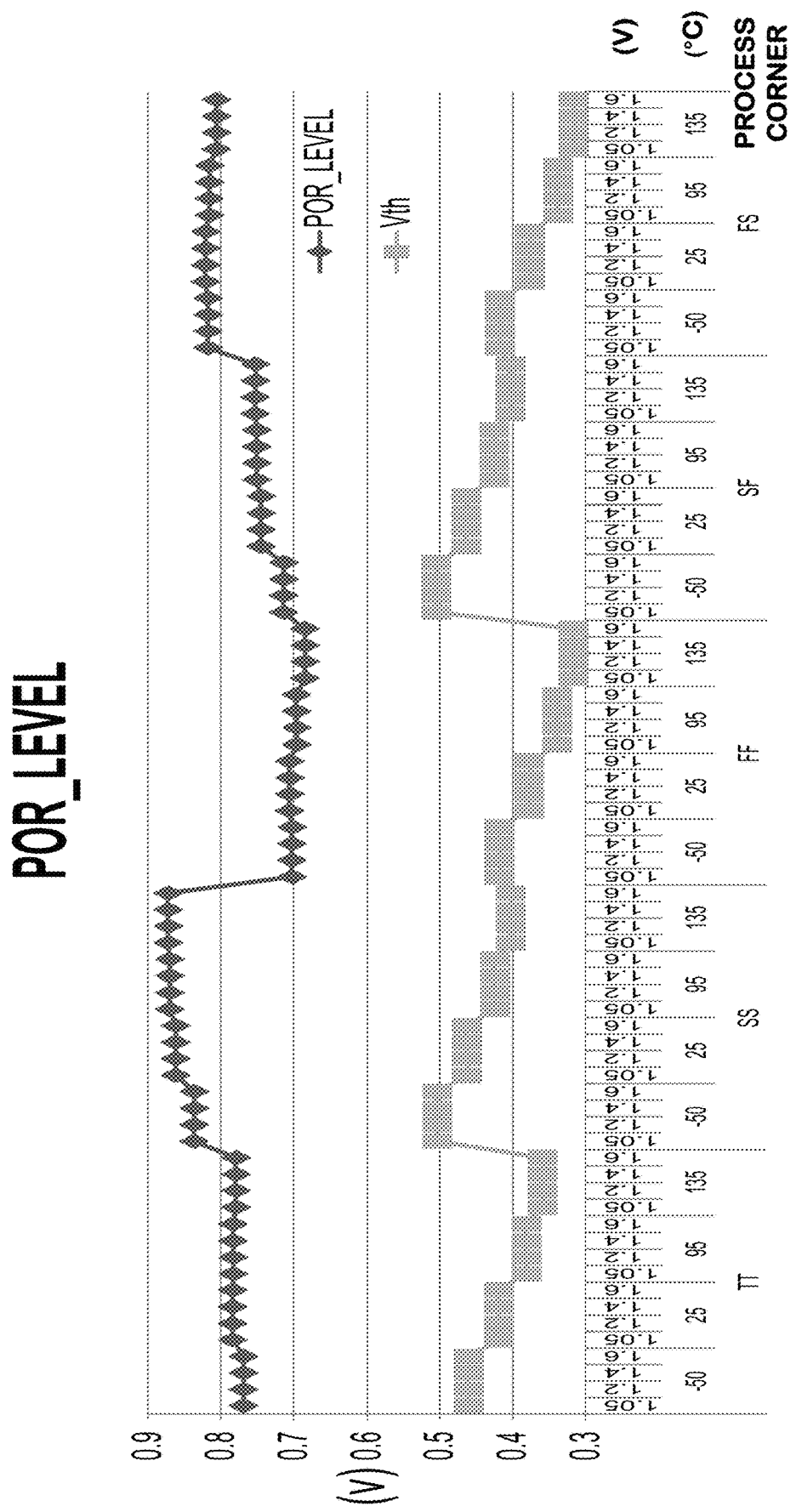
FIG. 11 is a process corner simulation graph for a circuit like that of FIG. 9.

FIG. 11 is a process corner chart showing superior operation of a circuit like that of FIG. 9, over variations in process, voltage and temperature PVT. The chart shows that the magnitude of the output POR signal ("POR level") is sufficient in that it exceeds the small MOS threshold Vth across TT, SS, FF, SF, FS process corners across a supply voltage range of 1.05 V, 1.2 V, 1.4 V and 1.6 V across a temperature range of −50° C., +25° C., +95° C. and +135° C.

In the present description, two nodes are "connected" if they are in current flow communication in operation of the circuit. Two nodes are "directly connected" if they have physical ohmic contact, such as by a resistive element like a polysilicon strip or plug, a resistive diffusion region, a wire or a metal link.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A circuit connected to generate a control signal in response to changes in voltage across first and second supply nodes, comprising:
   a p-channel transistor having a gate, a source connected to the first supply node, and a drain connected to an output node;
   an n-channel transistor having a gate connected to the gate of the p-channel transistor, a drain connected to the output node and a source connected to the second supply node;
   a resistive element connected between the gate of the p-channel transistor and the second supply node, wherein the resistive element is a passive resistive element; and
   a cascode-connected series of p-channel transistors MCn having gates connected to the second supply node and bodies connected to the first supply node, for n going from 1 to N, where N is an integer greater than or equal to 2, connected between the first supply node and the gate of the p-channel transistor,
   wherein a threshold voltage of the p-channel transistor is less than a threshold voltage of the cascode-connected series of p-channel transistors, and
   wherein, upon a ramp up of a voltage of the first supply node from a power off condition, the p-channel transistor and the n-channel transistor are configured to generate a power-on reset pulse, the power-on reset pulse being a voltage pulse on the output node that includes a ramp up to the voltage on the first supply node, such that the voltage pulse subsequently drops to the voltage on the second supply node as the voltage of the first supply node continues to increase to an operating voltage.

2. The circuit of claim 1, where N is greater than or equal to 4.

3. The circuit of claim 1, wherein the resistive element comprises a diffusion resistor.

4. The circuit of claim 1, wherein the resistive element comprises a polysilicon resistor.

5. The circuit of claim 1, wherein transistors in the cascode-connected series of p-channel transistors MC1 to MCn have gates directly connected to the second supply node and bodies directly connected to the first supply node.

6. The circuit of claim 1, wherein a magnitude of the power-on reset pulse has a peak that is greater than a threshold voltage of the n-channel transistor.

7. An integrated circuit having first and second supply nodes, comprising:
   an inverter circuit connected between the first and second supply nodes, having an input node and an output node;
   a p-channel transistor connected between the first supply node and the input node of the inverter circuit, and a resistive element connected between the input node of the inverter circuit and the second supply node, wherein the resistive element is a passive resistive element;
   a circuit generating a source-to-substrate voltage on the p-channel transistor that reduces a pull-up driving ability of the p-channel transistor relative to a pull-up driving ability of the inverter circuit; and
   a circuit connected between the first and second supply nodes configured to establish a known state in response to a pulse on the output node of the inverter circuit,
   wherein a threshold voltage of a first p-channel transistor of the inverter circuit is less than a threshold voltage of the p-channel transistor, and
   wherein, upon a ramp up of a voltage of the first supply node from a power off condition, the inverter circuit is configured to generate a power-on reset pulse, the power-on reset pulse being a voltage pulse on the output node that includes a ramp up to the voltage on the first supply node, such that the voltage pulse subsequently drop to a voltage on the second supply node as the voltage of the first supply node continues to increase to an operating voltage.

8. The circuit of claim 7, wherein the circuit to generate the source-to-substrate voltage comprise a cascode-connected series of p-channel transistors, the series including said first-mentioned p-channel transistor.

9. The circuit of claim 8, wherein gates of the p-channel transistors of the cascode-connected series are connected to the second supply node and bodies of the p-channel transistors of the cascode-connected series are connected to the first supply node.

10. The circuit of claim 9, wherein the cascode-connected series of the p-channel transistors includes N transistors, and N is an integer greater than or equal to 4.

11. The circuit of claim 7, wherein the resistive element comprises a diffusion resistor.

12. The circuit of claim 7, wherein the resistive element comprises a polysilicon resistor.

13. The circuit of claim 7, wherein the inverter circuit switches the output node to the first supply node when a voltage between the input node and the first supply node is more than a first trip point voltage, and switches the output node to the second supply node when a voltage between the input node and the second supply node is more than a second trip point voltage, to generate a power-on reset pulse.

14. A circuit connected to generate a control signal in response to changes in voltage across first and second supply nodes, comprising:
  a first p-channel transistor having a gate, a source connected to the first supply node, and a drain connected to an output node;
  a first n-channel transistor having a gate directly connected to the gate of the first p-channel transistor, a drain connected to the output node and a source connected to the second supply node;
  a circuit including a second p-channel transistor between the gate of the first p-channel transistor and the first supply node, and a resistive element connected between the gate of the first p-channel transistor and the second supply node, wherein the resistive element is a passive resistive element; and
  a circuit configured to induce source-to-body voltage on the second p-channel transistor more negative than a source-to-body voltage of the first p-channel transistor,
  wherein a threshold voltage of the first p-channel transistor is less than a threshold voltage of the second p-channel transistor, and
  wherein, upon a ramp up of a voltage of the first supply node from a power off condition, the first p-channel transistor and the first n-channel transistor are configured to generate a power-on reset pulse, the power-on reset pulse being a voltage pulse on the output node that includes a ramp up to the voltage on the first supply node, such that the voltage pulse subsequently drops to the voltage on the second supply node as the voltage of the first supply node continues to increase to an operating voltage.

15. The circuit of claim 14, wherein the circuit including the second p-channel transistor has an equivalent threshold voltage more than a threshold voltage of first p-channel transistor.

16. The circuit of claim 15, wherein the circuit including the second p-channel transistor has an equivalent channel length more than a channel length of first p-channel transistor.

17. The circuit of claim 15, wherein the circuit configured to induce the source-to-body voltage on the second p-channel transistor includes a cascode-connected series of p-channel transistors, the series including said second p-channel transistor.

18. The circuit of claim 17, wherein gates of the p-channel transistors in the cascode-connected series are connected to the second supply node and bodies of the p-channel transistors in the cascode-connected series are connected to the first supply node.

* * * * *